(12) United States Patent
Breul

(10) Patent No.: US 9,250,265 B2
(45) Date of Patent: Feb. 2, 2016

(54) HIGH-FREQUENCY TEST PROBE DEVICE COMPRISING CENTERING PORTION

(75) Inventor: Peter Breul, Constance (DE)

(73) Assignee: INGUN PRUEFMITTELBAU GMBH, Konstanz (DE)

( * ) Notice: Subject to any disclaimer, the term of this patent is extended or adjusted under 35 U.S.C. 154(b) by 273 days.

(21) Appl. No.: 13/980,116

(22) PCT Filed: Jan. 18, 2012

(86) PCT No.: PCT/EP2012/050698
§ 371 (c)(1),
(2), (4) Date: Jul. 17, 2013

(87) PCT Pub. No.: WO2012/101018
PCT Pub. Date: Aug. 2, 2012

(65) Prior Publication Data
US 2013/0285691 A1    Oct. 31, 2013

(30) Foreign Application Priority Data

Jan. 18, 2011  (DE) .................... 20 2011 001 670 U

(51) Int. Cl.
*G01R 1/067* (2006.01)
*H01R 11/18* (2006.01)

(52) U.S. Cl.
CPC ............ *G01R 1/06772* (2013.01); *H01R 11/18* (2013.01)

(58) Field of Classification Search
None
See application file for complete search history.

(56) References Cited

U.S. PATENT DOCUMENTS

| 4,740,746 A | 4/1988 | Pollock et al. |
| 5,944,548 A | 8/1999 | Saito |
| 5,982,187 A | 11/1999 | Tarzwell |
| 6,603,297 B1 | 8/2003 | Gessford et al. |
| 2004/0232934 A1* | 11/2004 | Sinclair ............... G01R 1/0466 324/755.05 |
| 2005/0007128 A1 | 1/2005 | Beckous et al. |
| 2006/0103397 A1 | 5/2006 | Parker et al. |

FOREIGN PATENT DOCUMENTS

| CN | 1340714 A | 3/2002 |
| CN | 1766651 A | 5/2006 |
| CN | 101923103 A | 12/2010 |
| EP | 2180326 A1 | 4/2010 |
| WO | 00/31835 A1 | 6/2000 |

* cited by examiner

*Primary Examiner* — Paresh Patel
(74) *Attorney, Agent, or Firm* — Bachman & LaPointe, P.C.

(57) ABSTRACT

A high-frequency test probe device comprising a contact section (18) which forms an inner contact (40) and an outer contact (44), which is designed to interact with a contact partner (30) that is to be contacted for testing purposes, and which is provided on an inner housing (16) at one end and can be contacted at a pickup end (20) for signal pickup at the other end. The inner housing is guided at least along some sections in an outer housing (10) and in an axially movable manner relative to same.

10 Claims, 2 Drawing Sheets

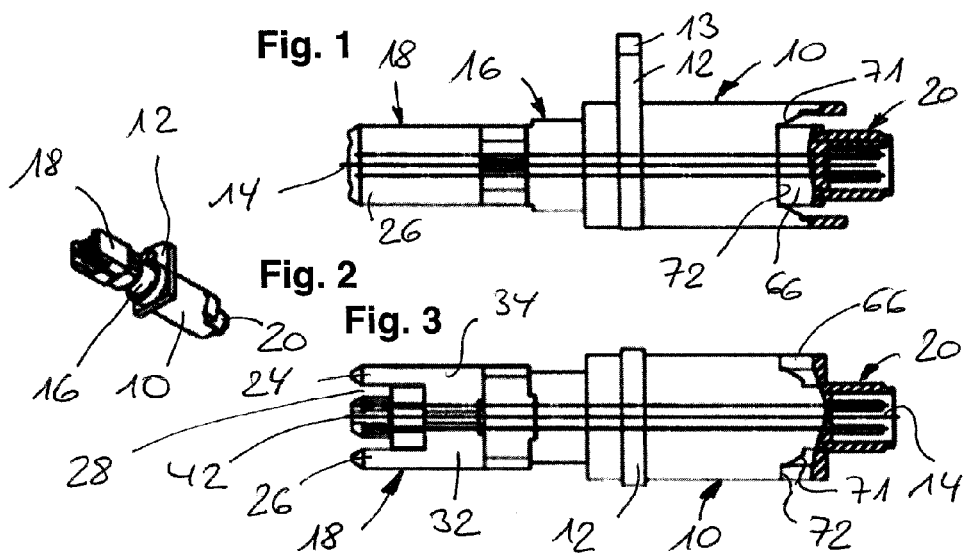
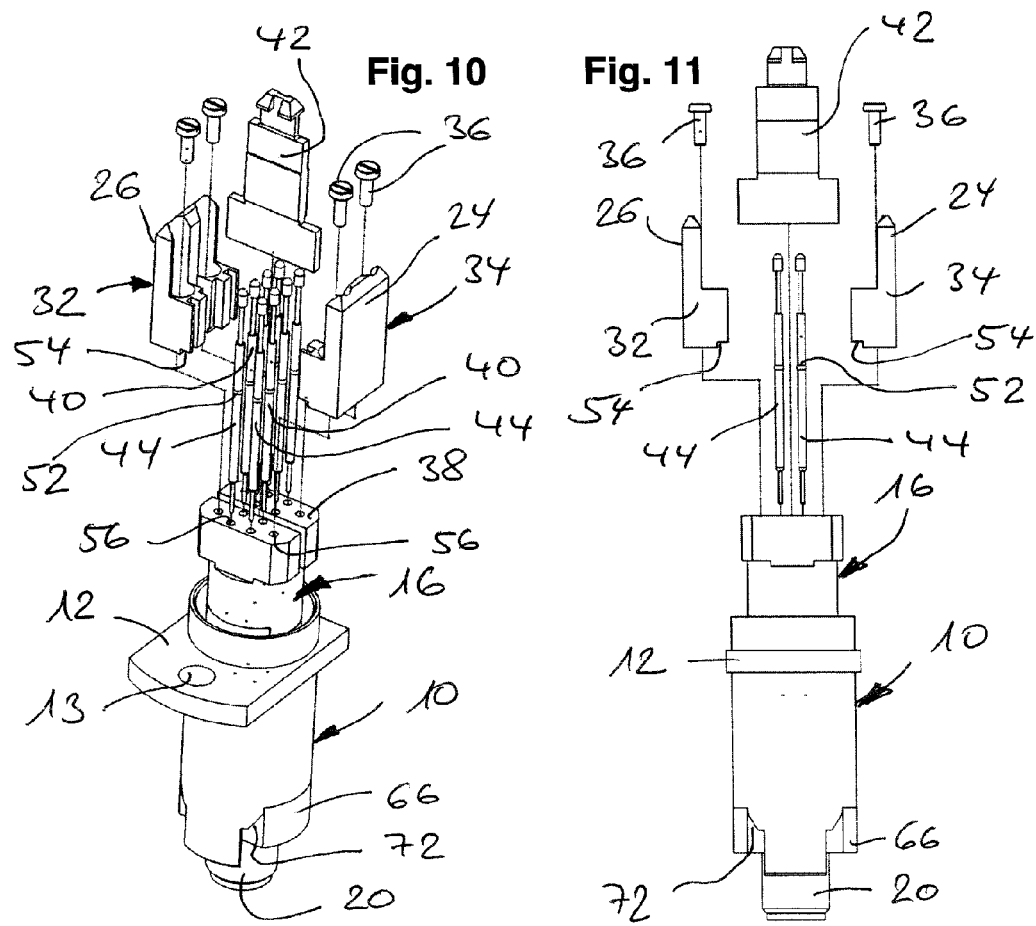

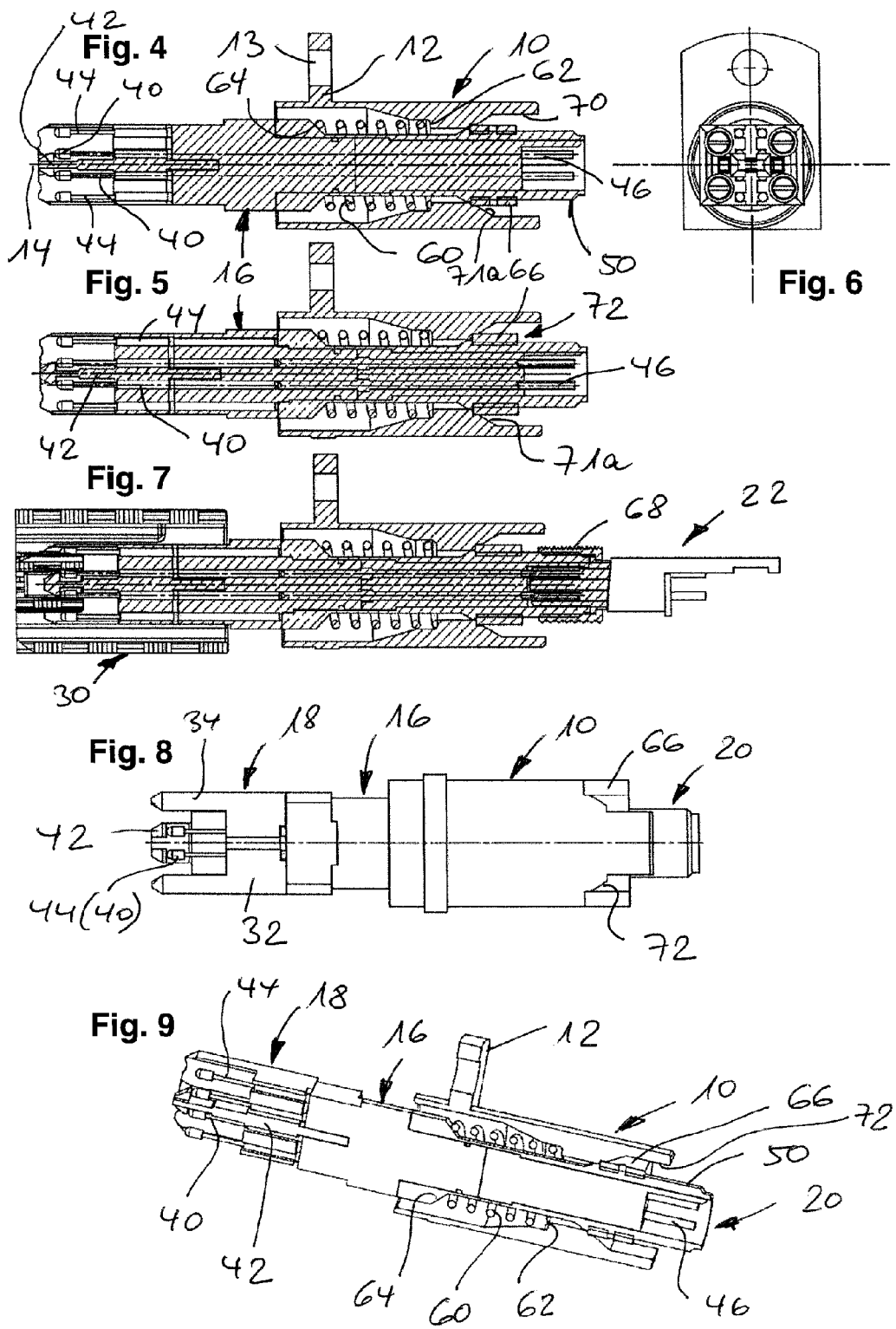

HIGH-FREQUENCY TEST PROBE DEVICE COMPRISING CENTERING PORTION

BACKGROUND OF THE INVENTION

The present invention relates to a high-frequency test probe device.

Such devices are generally known from the state of the art and are used in testing fields or other testing contexts in order to test a test partner (such as an electronic assembly comprising a suitable socket portion) for operability in that the test probe device is fitted as a plug and then suitable testing signals are applied to the contact partner via inner and outer contacts.

Especially in the high-frequency range (typically for signal frequencies in the range of 1 GHz or higher) it is very important to ensure contact quality in order to minimize reflexions or attenuations which are detrimental to a measuring signal. In addition there is a need for simplicity of construction and ease of maintenance, since the contacting elements used within the context of such test probe devices for realizing the respective test probes (typically provided as a multi-pin probe with regard to an inner contact) are subject to wear or other abrasion and need to be replaced. Generically this has frequently proven to be difficult leading to the entire device having to be replaced if the probe was worn down.

Also, with high-frequency test probe devices known from the art, in particular with regard to contact partners which are rectangular in cross-section or have a rectangular outer contour, it is important that these test probe devices can be easily aligned with such a contact partner; if these devices, in contrast to purely coaxial test contact devices, are twisted about a longitudinal direction twisting then leads to contacting problems and even inoperability of the device. Even though it must be ensured that positioning tolerances at the test location (place of application), which are always necessary within certain limits, can be reliably absorbed without endangering safe contacting.

It is therefore an object of the invention to propose a high-frequency test probe device according to the preamble of the main claim which is optimized as regards precise alignment of the device with a contact partner on the one hand and as regards tolerance relative to any positional and/or measurement deviations on the other, which in addition is easy to produce and implement and which permits contact-safe test connections.

SUMMARY OF THE INVENTION

The foregoing object is met by the high-frequency test probe of the present invention wherein, in an advantageous manner, to realize two possible relative positions between the inner and the outer contact, wherein depending on position, these requirements can be met: on the one hand it is ensured that when the contact portion is in engagement with the contact partner (which in effect means that a load is placed on the contact portion, i.e. the inner housing) the inner housing relative to the outer housing (which is typically attached to a feed unit or a carrier) can be moved by a predetermined tilting and/or turning angle, in other words, that a three-dimensional movement in space is possible within pre-set maximum angle limits in order to be able to flexibly react to dimensional errors, dimensional tolerances or the like at the test location, caused by the contact partner, without endangering fitting the probe or loosing contact quality.

Similarly the present invention makes it possible that in the second relative position between inner and outer housing (with a contact portion or inner housing not under load by the contact partner) the inner and outer housings are in a mutual torque-proof relationship, in other words they cannot be twisted relative to each other about the longitudinal axis. Advantageously this means that the high-frequency test probe device can be advanced towards the contact partner in a precise, centered and aligned manner, which is particularly important for the rectangular contact partners under discussion here (such as a USB data interface in the automobile field).

This is achieved according to the invention in that the inner housing comprises a centering portion which interacts with a guiding section (preferably designed in the manner of a motion link and widened at one end) in the outer housing in such a way that in a no-load locking position corresponding to the second relative position torsional strength is ensured, whilst on the other hand, in the first relative position in a correspondingly widened area of the guiding section, the advantageous three-dimensional relative movability between inner and outer housing is possible contrary to the direction in which the restoring force of the spring elements is effective, the only limitation being in its stroke which is due to the geometric conditions between centering portion and guiding section.

According to a further development of the invention this (preferably slot-shaped) guiding section is dimensioned such that it forms a stop including a suitable section for the centering portion for realizing the second relative position, which section ensures the torsional strength, in other words, a contour of the centering portion is adapted to match the stop of the guiding section in order to prevent a relative movement between the partners.

On the other hand, when an axial load is placed on the inner housing relative to the outer housing which acts against a restoring force of the spring means (which is typically implemented as a compression spring between the two housings), the centering portion can move into an expanding area of the guiding section, thus making room for the necessary relative movement according to a required tolerance or the maximum possible tolerance.

In practice this is realized by configuring the guiding section in the sleeve-shaped outer housing typically as a slot (which widens towards the rear in direction of the pick-up end), in which slot the centering section of the inner housing can glide as a radially protruding portion for moving along oblique edges of the slot.

Whilst the present invention can be realized in a particularly meaningful and favorable manner in a context, in which the contact portion comprises a polygonal, in particular rectangular outer or circumferential contour, the invention is not limited to this, but is suitable, in principle, for any given high-frequency test probe devices, typically also coaxial ones. Furthermore it is not necessary for the inner conductor to be multi-pole or to comprise a plurality of test probes, but it is convenient in the present context, i.e. the need for precise axial alignment.

In summary, the present invention makes it possible in a surprisingly constructive manner, to combine high contact reliability with flexibility and tolerance in the face of dimensional deviations so that in particular for high load cycles the present invention comprises excellent performance characteristics.

BRIEF DESCRIPTION OF THE DRAWINGS

Further advantages, features and details of the invention are revealed in the description below of preferred embodiments and in the figures, in which:

FIG. 1 shows a partially sectioned side view of the high-frequency test probe device according to a first embodiment of the invention;

FIG. 2 shows a perspective view of the device according to FIG. 1;

FIG. 3 shows a view of the device according to FIG. 1 and FIG. 2, rotated by 90° along the longitudinal axis;

FIG. 4 shows a longitudinal section through the device of FIG. 1 through the center axis;

FIG. 5 shows a longitudinal section analogue FIG. 4, but axially offset in the plane of the contact pins;

FIG. 6 shows a view of the end face of the device of FIGS. 1 to 5 seen from the direction of the contact portion;

FIG. 7 shows a sectional view analogue FIG. 5, but connected at both ends to a contact partner/a socket for a signal pick-up;

FIG. 8 shows a side view of the embodiment but axially rotated by 90° relative to the views in FIG. 4 to FIG. 7;

FIG. 9 shows a perspective longitudinal view of the device of FIG. 1 to FIG. 8;

FIG. 10 shows an explosive view for illustrating assembly of the contact portion in a perspective view, and FIG. 11 shows an explosive view analogue FIG. 10 but as a side view.

DETAILED DESCRIPTION

The high-frequency test probe device according to a first embodiment of the present invention comprises an outer housing in the form of a hallow cylindrical sleeve, which comprises a radially protruding flange portion 12 for attaching the device as a one-piece item. In the metallic outer housing 10 an inner axially movable inner housing 16 made from a plastic material is guided along a central or longitudinal axis 14, which inner housing extends through the cylindrical sleeve of the outer housing 10 with a contact portion 18 at one end (in the FIGS. 1, 3 in the left-hand area) and at the other end, the pick-up end, provides contacts of the contact portion 18 at a socket portion 20 for contacting via a suitably connectable contact plug 22 (FIG. 7).

As made clear by the comparison between the mutually axially rotated side views in FIGS. 1, 3, the contact portion 18 is configured as a rectangular plug area with two shell portions 24, 26 extending in longitudinal direction at the narrow sides, which between them form a cavity 28, in which test pins are arranged which realize an inner contact and an outer contact.

As recognizable in FIG. 2 this creates a modular unit, which can be attached to suitable operating or feeding means not shown by means of the flange portion 12 (or a bore 13 provided therein) and joined as a test probe device in the envisaged known manner, to engage with a suitable contact partner 30 (FIG. 7).

The explosive views of FIGS. 10, 11 show the constructional realization of the contact portion with the mentioned plurality of contact pins: these explosive views show that the contact area 18 or its wall sections 24, 26 are realized by a pair of plastic shell elements 32, 34, which in the side view are angled in an L-shaped manner, forming the wall sections 24, 26 and being detachably fastened by means of screw connections 36 to an end face 38 of the inner housing 16 (comprising a plastic body).

The explosive views of FIGS. 10, 11 also show, how a group of four inner (radially central) contact pins 40, insofar realizing four poles of a center contact, are arranged on both sides of the flat sides of a platelet-type separating element 42, wherein the separating element 42, see FIGS. 10, 11, is retained at the bottom by a transverse slot of end face 38 or laterally guided in respective longitudinal grooves of the plastic elements 32, 34.

Radially outward from the first contact pins 40 in the end face 38, there is provided a group of outer (second) contact pins 44, which (see the sectional views of FIGS. 4, 5, 7) are not guided individually to associated inner contact pick-up pins 46 in the socket area 20, but together engage with a metallic housing portion 48 of the inner housing 16 and thus, as an electric mass, are looped through the (here coaxially round) outer contact 50 to the outer contact 20 at the pick-up end.

Again, as revealed in the explosive views of FIGS. 10, 11, the contact pins 40, 44 realized here by way of example as spring-mounted test pins (of the respective group for the inner conductor or the outer conductor), comprise an annular bead or shoulder 52 on the lateral surface, which is fixed by means of a shoulder or stop 54, inside the plastic shell elements 32, 34 or on the bottom thereof, in axial direction in the inner housing 16 or on its outer end-face surface 38. Expressed in concrete terms, a shoulder portion 54 in this fastening state overlaps a bead 52 so as to prevent penetration into associated bores 56 of the end face 38, thus fixing it in its fastening position in the test probe device. At the same time, it is possible, after removing the plastic shells 32, 34 (following undoing the associated fixing screws 36), to remove the test pins 40, 44 one after another or in one go, such as for the purpose of replacing them as a result of defects or wear. In this way a test probe device is created in an efficient, constructionally simple and easy-to-handle manner, which is suitable also for prolonged use.

The end-face view of FIG. 6 shows the configuration which can be achieved following assembly according to the explosive views of FIGS. 10, 11: the narrow sides of the rectangular circumferential contour of the contact portion are limited by the wall sections 24, 26 of the shell bodies 32, 34, which in turn are detachably fastened on the end faces 38 of the inner housing 16 by means of screws 36. The wall sections 24, 26, in their inner space 28, form a space in which outer second contact pins 44 reside, extending in pairs along longitudinal sides of the rectangular contour for forming the outer or the ground connection. Inside it and separated from each other by the separating element 42, are arranged the four mutually insulated inner conductor poles, which are individually looped-through to the socket area 20, resulting in the shown embodiment being a five-pole arrangement (with common ground or outer contact) which is suitably configured in the shown way to test, in particular, the contacting of data interfaces such as USB data interfaces, mainly for the car manufacturing industry.

The longitudinal section views in FIGS. 4, 5, 7, 9 also show how the inner housing 16 and the outer housing 10 are tensioned against each other, i.e. pushed axially apart, by a spiral spring along axial direction 14, wherein the spiral spring 60, at one end, engages at an inner annular shoulder 62 of the outer housing, and at the other end engages at a conical shoulder 64 of the metallic inner housing portion 48, pushing the partners apart. A maximum stroke movement is limited by a stop element 66 fitted to the outer surface of the inner housing, which element is positioned adjacently to the socket portion 20. In the manner shown in FIGS. 5 and 7 the individual poles of the inner contact (i.e. the first contact pins 40) are guided through corresponding longitudinal bores in the inner housing 16 to the socket portion 20, where they are connected respectively with an associated pick-up pin 46, so that as shown in FIG. 7, an otherwise known plug unit with four inner contact receptacles and an outer cap nut 68 for outer conductor contacting can access the five-pole signal for further processing.

With reference to FIGS. 4 to 9 it will now be explained how the inner housing 16 can be swiveled or tilted relative to the outer housing, when by compressing the compression spring 60, such as in an engaged state of the contact portion, the locking and guiding portion 66 is moved out of the engaged state as shown in FIGS. 4, 5, 7, 8, 9 (in the figure plane towards the right).

Since, as can easily be recognized in the longitudinal section view in FIGS. 4, 5, 7, the outer housing 10 forms a guiding section 70 which in direction of socket 20 is widened and opened and in direction of the contact portion conically tapers to become a flat stop 72 (FIG. 1), the position shown in the figures and supported by spring-expansion action, ensures that a torsionally rigid or torsionally stable position is achieved between inner housing 16 and outer housing 10 relative to the longitudinal axis 14: as shown in FIG. 1 portion 66 engages here at the flat end of the guiding section 70 in such a way that a relative movement is not possible. In this position (second relative position) both housings are tensioned against each other due to the action of spring 60.

Now, if the compression spring 60 is further compressed by bringing a force to act upon the inner housing in cooperation with a contact partner (direction of force introduction on the right in the figure plane), the socket portion 20 or the locking element 66 moves out of the locking position on portion 72 into the widening area of the guiding section 70 with the result that a (limited) rotational movement is possible between the housings about axis 14 and an (also limited) swiveling or tilting movement of the two housings towards each other, in the three-dimensional space. Above all, the maximum widening of the guiding section 70, which insofar acts as a motion link, determines a maximum stroke of this relative movement, depending on a thickness of the stop element 66.

In practice this has the advantage that in the contact state (i.e. when a contact portion is placed on a contact partner for testing purposes in conjunction with the mentioned compression spring 60) the inner housing 16 with fitted contact portion can move with a certain tolerance (for compensating for potentially existing dimensional tolerances at the testing location), thus permitting flexible and error-tolerant measuring. At the same time, when the housings are not under load, the compression spring 60 again performs (radial) centering initiated by the guiding section 70/the stop surface 72 and a conical portion 71a in conjunction with portion 66, by enabling the portion 66 to glide along the edge of the guiding section comprising an inclined wall 71 in a motion-link-like manner and centering in the home position (see FIG. 1) by means of the cone 71a.

The present invention is not limited to the embodiment shown. For example, it is possible to vary almost at random the aspect of the design of the contact portion with suitably replaceable test probes or contact pins, wherein these test probes can then be themselves designed as spring-loaded coaxial test probe units or as simple pins.

It is also possible, in terms of preferred further developments of the invention, to extend the above described possibility of radially centering the housings 16, 10 to include other test probe or plug configurations and/or socket configurations, both when the housings are in a load-free state and when moving with a certain tolerance towards each other, while portion 66 is moving (even partially, as required) out of guiding section 70; this does not necessitate a rectangular design of the described contact portion.

The invention claimed is:

1. A high frequency test probe device comprising:

a hollow cylindrical outer housing;

an inner housing received in the outer housing and movable therein along a longitudinal axis, the inner housing having a contact portion on one end and a pick-up on the other end;

a contact partner on the inner housing is selectively contacted by the contact portion;

the inner housing has a centering portion configured to interact with the outer housing, the inner housing is movable along the longitudinal axis between a first relative position and a second relative position;

a spring has one end which engages a first shoulder of the outer housing and another end which engages a second shoulder on the inner housing, wherein the spring pushes the outer housing and inner housing apart;

wherein in the first relative position the contact portion is in engagement with the contact partner and the inner housing is tilted in a plane vertical to the longitudinal axis about a predefined maximum angle, relative to the longitudinal axis defined by the outer housing and corresponding to a direction of engagement, and wherein in the second relative position the contact portion is detached from the contact partner, the inner housing is held non-rotatably about the longitudinal axis in the outer housing against the bias of the spring.

2. The device according to claim 1, wherein the contact portion comprises a polygonal contour.

3. The device according to claim 1, wherein the outer housing is configured for interacting with the inner housing in such a way that in the first relative position the inner housing is rotatable about a predefined maximum angle of rotation about the longitudinal axis.

4. The device according to claim 1, wherein the centering portion of the inner housing is configured as a stop for a guiding section in the outer housing.

5. The device according to claim 4, wherein the guiding section is adapted to match the stop in the manner of a motion link in such a way that in the second relative position the guiding section prevents twisting of the inner housing about the longitudinal axis, and wherein the restoring force of the spring pretensions the stop in a bottom of the guiding section dimensioned according to a width of the stop.

6. The device according to claim 4, wherein the guiding section comprises an inclined wall wherein in the first relative position the guiding section, in conjunction with the stop, determines a maximum angle of rotation by which the inner housing is rotated relative to the outer housing about the longitudinal axis.

7. The device according to claim 1, wherein the spring is configured as a compression spring held and supported in a radial intermediate space between the inner housing and the outer housing.

8. The device according to claim 1, wherein a plurality of first contact pins mounted in the axial direction of the inner housing and forming the inner contact are provided in a radial central area of the contact portion such that the first contact pins are individually replaced following detaching and/or removing a locking portion associated with the inner housing.

9. The device according to claim 8, wherein the outer contact comprises a plurality of second contact pins arranged in parallel to the first contact pins, wherein second contact pins are held in an edge area of the contact portion so that they can be individually replaced.

10. The device according to claim 1, wherein the high frequency test probe device is a five-pole high frequency test probe with four first contact pins for contacting a data interface according to the USB standard.

\* \* \* \* \*